(12) United States Patent
Hirano et al.

(10) Patent No.: US 8,816,759 B2
(45) Date of Patent: Aug. 26, 2014

(54) ELECTRIC CIRCUIT AND SEMICONDUCTOR DEVICE

(71) Applicant: Fujitsu Semiconductor Limited, Kanagawa (JP)

(72) Inventors: Mitsuhiro Hirano, Akisima (JP); Shuji Hamada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/063,012

(22) Filed: Oct. 25, 2013

(65) Prior Publication Data

US 2014/0184298 A1    Jul. 3, 2014

(30) Foreign Application Priority Data

Dec. 28, 2012   (JP) ................... 2012-287745

(51) Int. Cl.
*H03K 5/00*    (2006.01)
(52) U.S. Cl.
USPC ............................. 327/551; 327/34

(58) Field of Classification Search
USPC ............................. 327/551–559, 34
See application file for complete search history.

(56) References Cited

U.S. PATENT DOCUMENTS

| | | | |
|---|---|---|---|
| 6,654,916 B1 | 11/2003 | Furukawa | |
| 7,242,217 B2 * | 7/2007 | van Wageningen et al. | 326/40 |
| 2011/0131263 A1 * | 6/2011 | Vasyltsov et al. | 708/251 |

FOREIGN PATENT DOCUMENTS

| | | |
|---|---|---|
| JP | 1-114120 A | 5/1989 |
| JP | 2000-323966 A | 11/2000 |
| JP | 2009-55470 A | 3/2009 |

* cited by examiner

*Primary Examiner* — Dinh T. Le
(74) *Attorney, Agent, or Firm* — Arent Fox LLP

(57) ABSTRACT

An electric circuit includes a delayed clock generation circuit to which a first clock is supplied and which is configured to generate a first delayed clock and a second delayed clock, the first delayed clock being the first clock delayed by a first delay amount, and the second delayed clock being the first clock delayed by a second delay amount different from the first delay amount, an OR gate configured to receive the first clock, the first delayed clock, and the second delayed clock as inputs and to output a second clock, and a scan circuit to which the second clock is supplied.

8 Claims, 12 Drawing Sheets

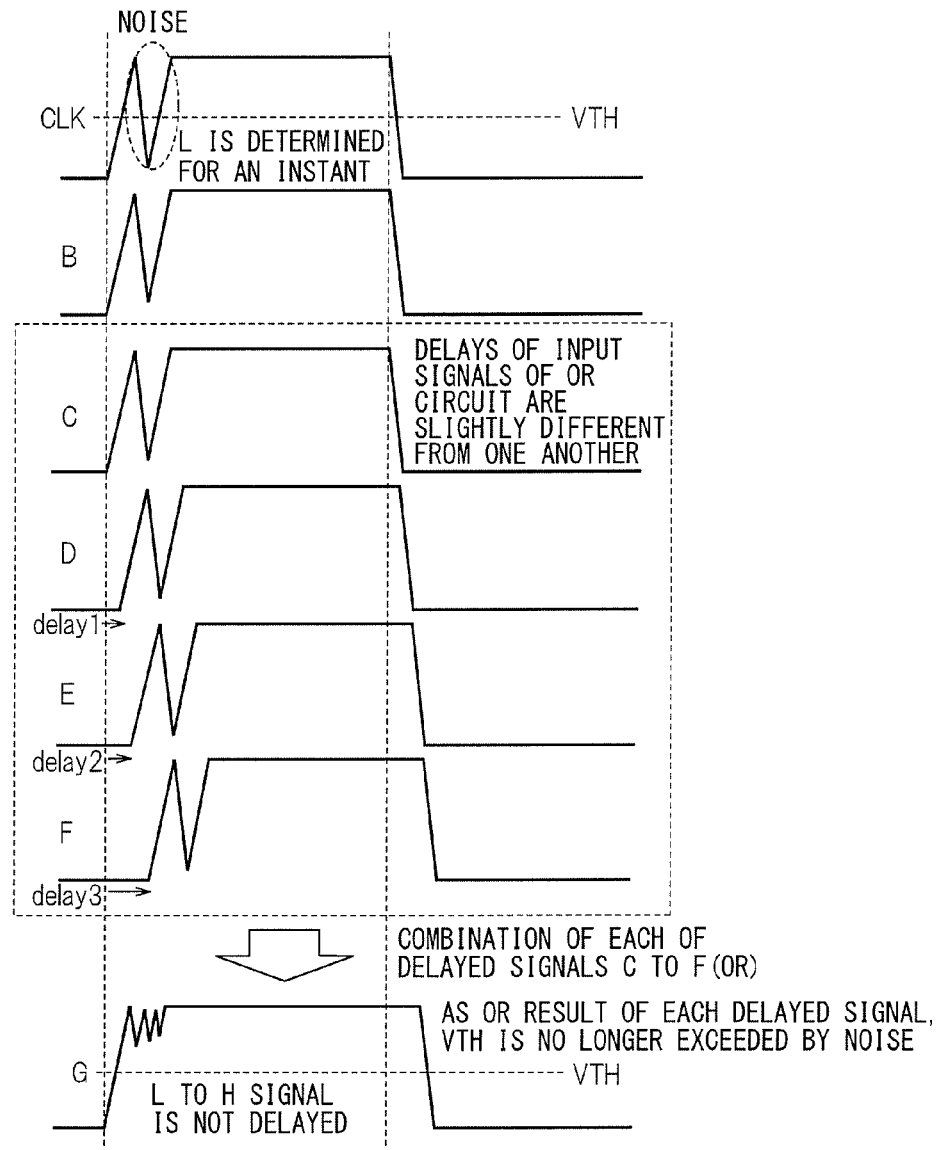

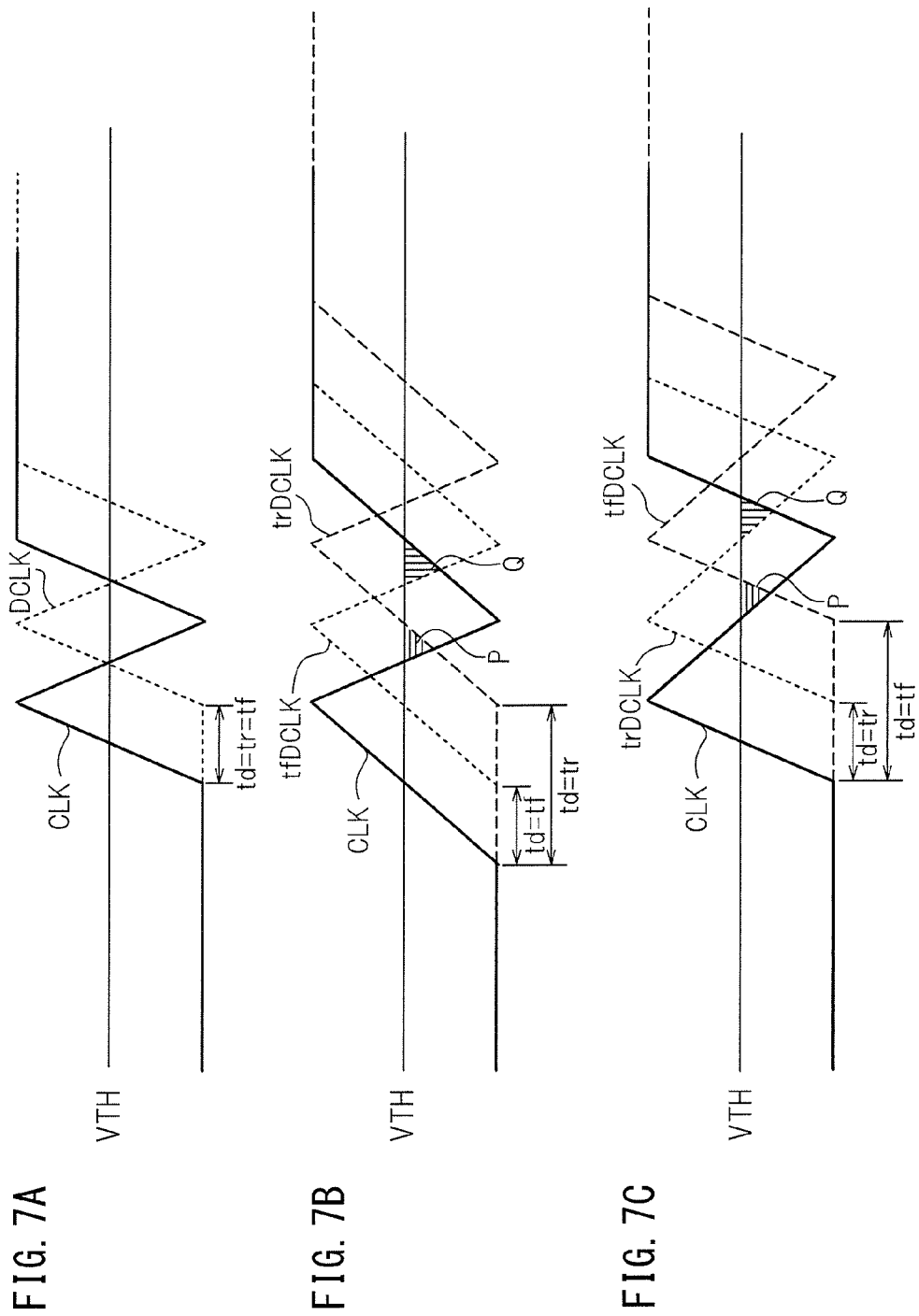

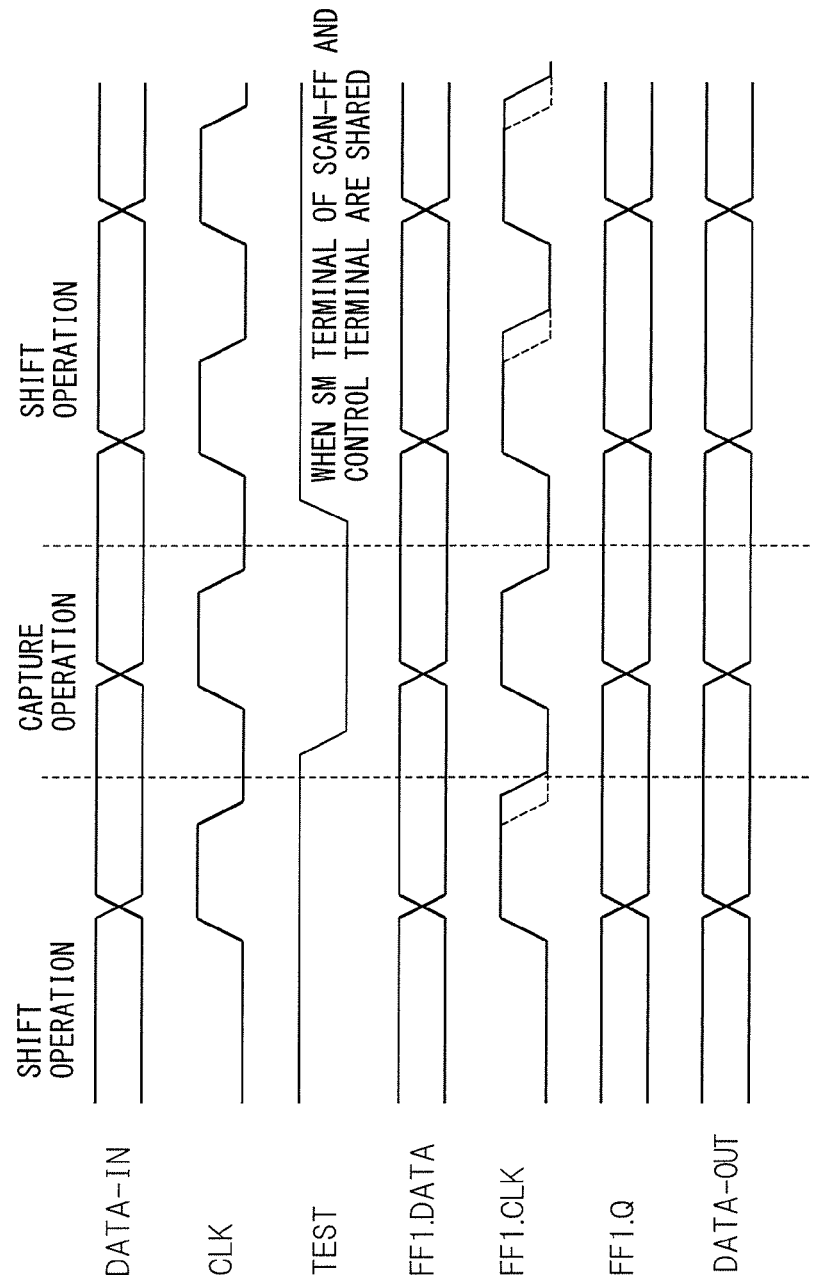

US 8,816,759 B2

ELECTRIC CIRCUIT AND SEMICONDUCTOR DEVICE

CROSS-REFERENCE TO RELATED APPLICATION

This application is based upon and claims the benefit of priority of the prior Japanese Patent Application No. 2012-287745, filed on Dec. 28, 2012, the entire contents of which are incorporated herein by reference.

FIELD

The embodiments discussed herein relate to an electric circuit and a semiconductor device.

BACKGROUND

In the manufacturing process of a semiconductor device, various kinds of tests are carried out in each process and the test results are fed back in order to remove a defective product and to enhance yield. For example, an operation test to inspect whether the semiconductor device operates electrically normally and meets the specifications is performed, and only those that have passed the test are shipped.

As the circuit scale of an LSI increases, it is difficult to detect the internal operating state, and therefore, in order to detect the internal operating state, a scan circuit is formed. The scan circuit is a shift register in which flip-flop circuits (FF) are connected in the form of a chain and configured to output data of a logical circuit captured at a certain point of time to outside by supplying a clock to the FF. Normally, the scan circuit is formed by the FF used when the normal operation (system operation) is performed within the semiconductor device, however, there is also a case where the FF provided to form the scan circuit is used.

In the operation test of a semiconductor device, the test is carried out under environmental conditions set in accordance with the specifications, and also a predetermined test pattern is determined so as to check whether all the functions as to predetermined test items operate normally, and then, the test pattern is performed. In order to efficiently check the operations as to the predetermined test items, for example, in the case where there are portions capable of operating independently within the semiconductor device, by carrying out the tests by causing those portions to operate in parallel, the test time is reduced. As the number of circuits that operate in parallel increases, the load of the semiconductor device becomes higher.

The scan circuit has a number of FFs and the number of FFs operate simultaneously in accordance with the clock, and therefore, a large amount of current flows temporarily and the load of the semiconductor device becomes higher than that at the time of the normal operation. Because of this, a large voltage drop occurs in the power source supply circuit and noise occurs in accordance therewith, and there may be a case where the semiconductor device that does not cause any problem in the normal operation is determined to be defective by the test. The semiconductor device such as this should be originally regarded as a conforming product because it operates normally in the normal operation, and if such a product is regarded as a defective product, there arise such a problem that yield reduces.

Up to now, as a noise reduction circuit for removing noise that occurs when a power source voltage drops, the Schmidt circuit and the circuit that uses a CR filter are known, however, there has been such a problem that the maximum operating frequency is limited. Because of this, a noise reduction circuit for removing noise by inputting an input signal and a delayed signal, which is the input signal delayed by a delay circuit, to the logical gate is proposed. The proposed noise reduction circuit has two noise reduction circuits connected in two stages and has a function for preventing both the noise from the "high (H)" level to the "low (L)" level and the noise from the L level to the H level.

RELATED DOCUMENTS

[Patent Document 1] Japanese Laid Open Patent Document No. 2009-055470
[Patent Document 2] Japanese Laid Open Patent Document No. 01-114120
[Patent Document 1] Japanese Laid Open Patent Document No. 2000-323966

SUMMARY

According to an aspect of the embodiments, an electric circuit includes: a delayed clock generation circuit to which a first clock is supplied and which is configured to generate a first delayed clock and a second delayed clock, the first delayed clock being the first clock delayed by a first delay amount, and the second delayed clock being the first clock delayed by a second delay amount different from the first delay amount; an OR gate configured to receive the first clock, the first delayed clock, and the second delayed clock as inputs and to output a second clock; and a scan circuit to which the second clock is supplied.

According to another aspect of the embodiments, a semiconductor device includes: a logical circuit; a scan circuit including a plurality of flip-flop circuits; and a noise reduction circuit of a clock supplied to the scan circuit, wherein the noise reduction circuit includes: a delayed clock generation circuit to which a first clock is supplied and which is configured to generate a first delayed clock and a second delayed clock, the first delayed clock being the first clock delayed by a first delay amount, and the second delayed clock being the first clock delayed by a second delay amount different from the first delay amount; and an OR gate configured to receive the first clock, the first delayed clock, and the second delayed clock as inputs and to output a second clock.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 5 is a time chart illustrating the operation of the noise reduction circuit of the first and the second embodiment;

FIG. 7A to FIG. 7C are diagrams for explaining the grounds of the first condition described above;

FIG. 12 is a time chart illustrating the operation of the scan circuit in FIG. 11 at the time of the scan operation.

DESCRIPTION OF EMBODIMENTS

Before the noise reduction circuit of the embodiment is explained, a general noise reduction circuit will be explained.

Figure 1A:
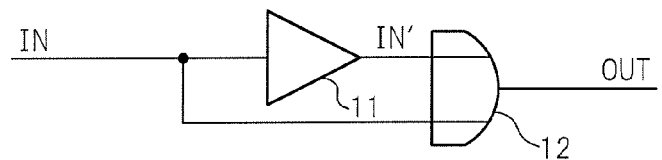
FIG. 1A is a diagram illustrating a circuit configuration of a noise reduction circuit.
Figure 1B:
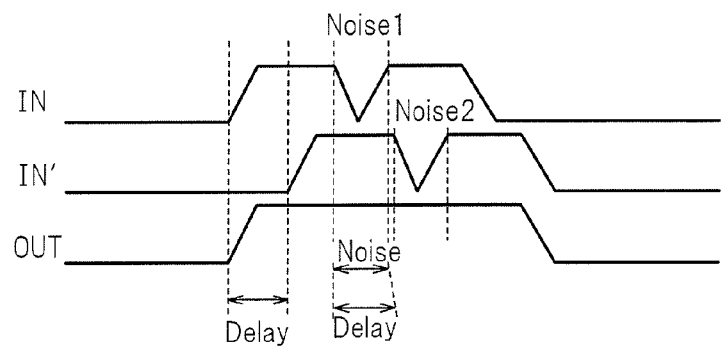
FIG. 1B to FIG. 1D are time charts illustrating the operation of the noise reduction circuit in FIG. 1A.
Figure 1C:
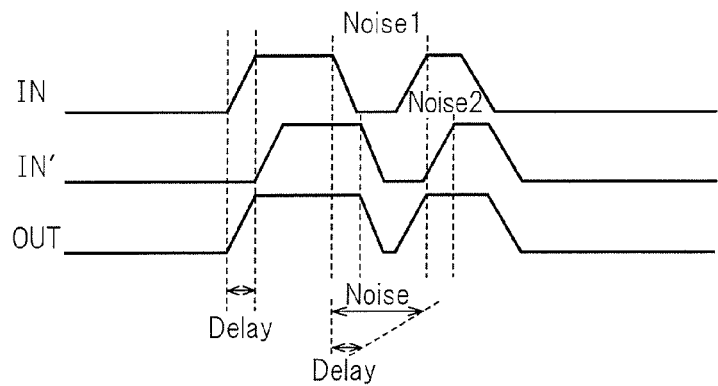
Figure 1D:
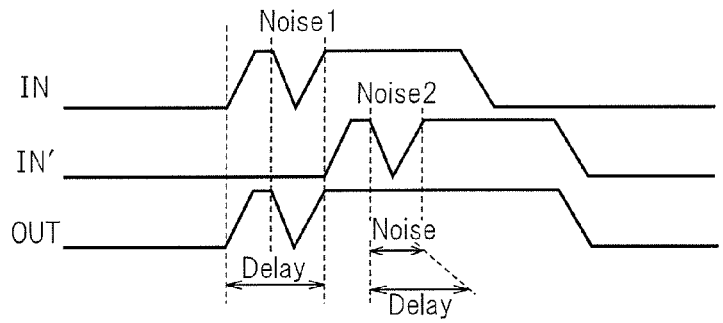

FIG. 1A is a diagram illustrating a circuit configuration of a noise reduction circuit and FIG. 1B to FIG. 1D are time charts illustrating the operation of the noise reduction circuit in FIG. 1A.

As illustrated in FIG. 1A, the general noise reduction circuit has a delay circuit 11 configured to delay an input signal IN and an OR gate 12 configured to receive the input signal IN and a delayed signal IN', which is an output of the delay circuit 11 as inputs. The OR gate 12 outputs an output signal OUT. For example, in the case where the noise reduction circuit in FIG. 1A is applied to the scan circuit, a clock is input to the noise reduction circuit as the input signal IN and the output signal OUT is supplied to the flip-flop (FF) of the scan circuit.

As illustrated in FIG. 1B, in the case where the delay amount (Delay) of the delay circuit 11 is greater than the signal width of noise, the noise is removed. As illustrated in FIG. 1B, Noise 1 occurs in the input signal IN, however, it does not overlap Noise 2 of the delayed signal IN', and therefore, the noise is removed by a logical sum operation.

Figure 10:
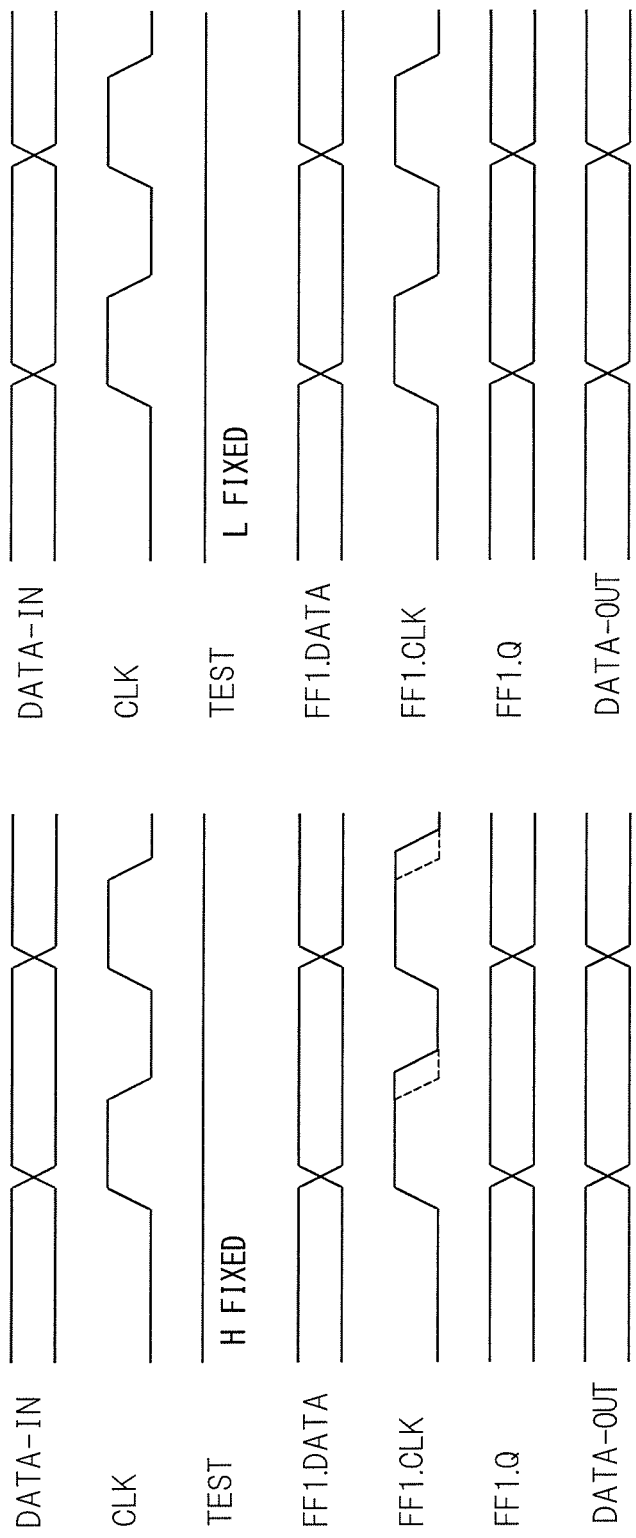
FIG. 10A is a time chart illustrating the operation at the time of the scan test of the scan circuit in FIG. 9.
FIG. 10B is a time chart illustrating the operation at the time of the system operation of the scan circuit in FIG. 9.

In contrast, as illustrated in FIG. 10, in the case where the delay amount (Delay) of the delay circuit 11 is smaller than the signal width of noise, the noise is not removed. As illustrated in FIG. 10, Noise 1 occurs in the input signal IN and part of which overlaps Noise 2 although Noise 2 of the delayed signal IN' is shifted by an amount corresponding to Delay, and therefore, the noise is not removed even by the logical sum operation.

On the other hand, as illustrated in FIG. 1D, if noise occurs during the delay amount (Delay) of the delay circuit 11 immediately after the input signal IN changes from L to H, the noise is not removed. As described previously, in the case where the noise reduction circuit in FIG. 1A is applied to the scan circuit, the output signal OUT is supplied to the flip-flop (FF) of the scan circuit. Because of this, noise is likely to occur immediately after the input signal IN changes from L to H as illustrated in FIG. 1D.

As above, if the delay amount (Delay) of the delay circuit 11 is increased, the problem in FIG. 10 can be avoided, however, the problem in FIG. 1D tends to occur on the contrary. Because of this, when the noise reduction circuit in FIG. 1A was designed, the delay amount of the delay circuit 11 was set by supposing the noise amount. The delay amount is not allowed to be changed from the value determined at the time of the design, and therefore, there has been such a problem that in the case where an amount of noise that is not suitable to the supposed delay amount occurs, there is no longer a noise removal effect. In other words, the noise reduction circuit in FIG. 1A is a circuit affected by the amount of noise.

As describe previously, in the proposed noise reduction circuit, the noise reduction circuits are connected in two stages so that noise that occurs immediately after the input signal changes from L to H is removed. However, the clock supplied to the FF of the scan circuit is an output signal output from the noise reduction circuit in the subsequent stage, and the noise that occurs immediately after the output signal changes from L to H is not removed.

Further, in the above-mentioned proposed noise reduction circuit, the delay amount of the delay circuit is fixed, and therefore, there are limitations that the circuit is effective only in the case where "delay amount of the delay circuit>noise signal width" holds. Further, it has been found that there are many cases where noise is not removed because, for example, noise is not cancelled even in the case where "delay amount of the delay circuit>noise signal width" holds actually.

According to an embodiment, an electric circuit having extended the range of conditions under which noise can be cancelled is realized.

Further, according to an embodiment, a noise reduction circuit for effectively removing noise that occurs in a clock supplied to a scan circuit is realized.

Figure 2:
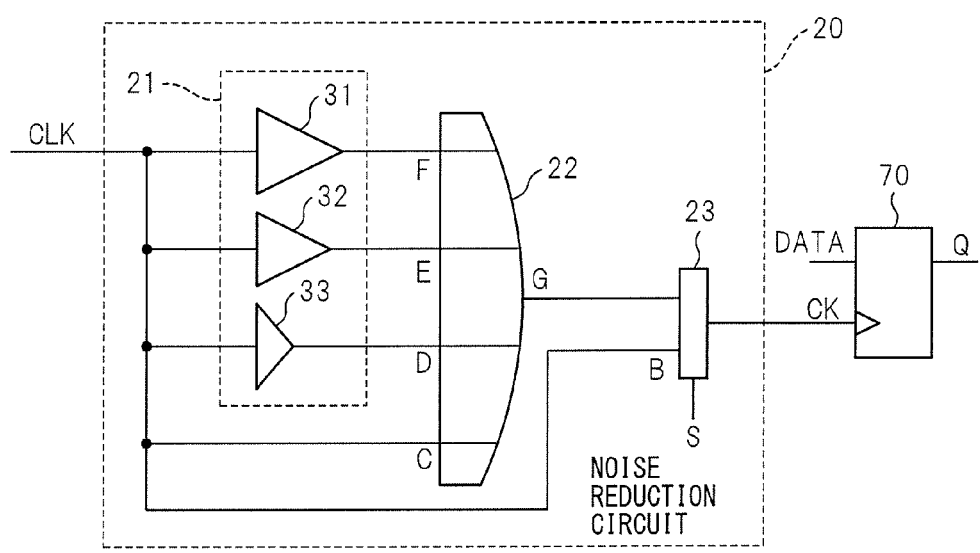
FIG. 2 is a diagram illustrating a circuit configuration of a noise reduction circuit of a first embodiment.

FIG. 2 is a diagram illustrating a circuit configuration of a noise reduction circuit 20 of a first embodiment. The noise reduction circuit 20 of the first embodiment generates a noise-removed clock, which is a clock CLK from which noise has been reduced, and outputs CK or the noise-removed clock as the processing clock CK according to the operation mode. The processing clock CK is supplied to a clock input of a flip-flop (FF) 70 forming the scan circuit.

As illustrated in FIG. 2, the noise reduction circuit 20 has a plural delayed clock generation circuit 21, an OR gate, and a selection circuit (selector) 23. The plural delayed clock generation circuit 21 generates a plurality of delayed clocks D, E, and F, which are each CLK delayed by a different delay amount. It is assumed that the delayed clocks D, E, and F are delayed from CLK by delay 1, delay 2, and delay 3, and delay 1<delay 2<delay 3 holds. The OR gate performs a logical sum operation using CLK input as a signal C and the delayed clocks D, E, and F as inputs and outputs as an output G. The selector 23 selects one of the output G of the OR gate and CLK input as the signal C according to a selection signal S and outputs the processing clock CK. Because of this, the influence of the signal delay etc. in the noise reduction circuit 20 is limited at the time of the scan test in which the scan circuit is caused to operate to avoid the influence at the time of the normal operation.

As illustrated in FIG. 2, the plural delayed clock generation circuit 21 has delay circuits 31 to 33 configured to receive CLK as an input and having different delay amounts. The delay circuits 31 to 33 are realized by various kinds of publicly-known methods and, for example, they are realized by forming a buffer circuit by connecting in series two identical inverters and making different the number of stages of the buffer circuit connected in series. It may also be possible to realize them by making different the size, such as the gate length and the gate width, of the transistor forming the delay circuit.

Figure 3:
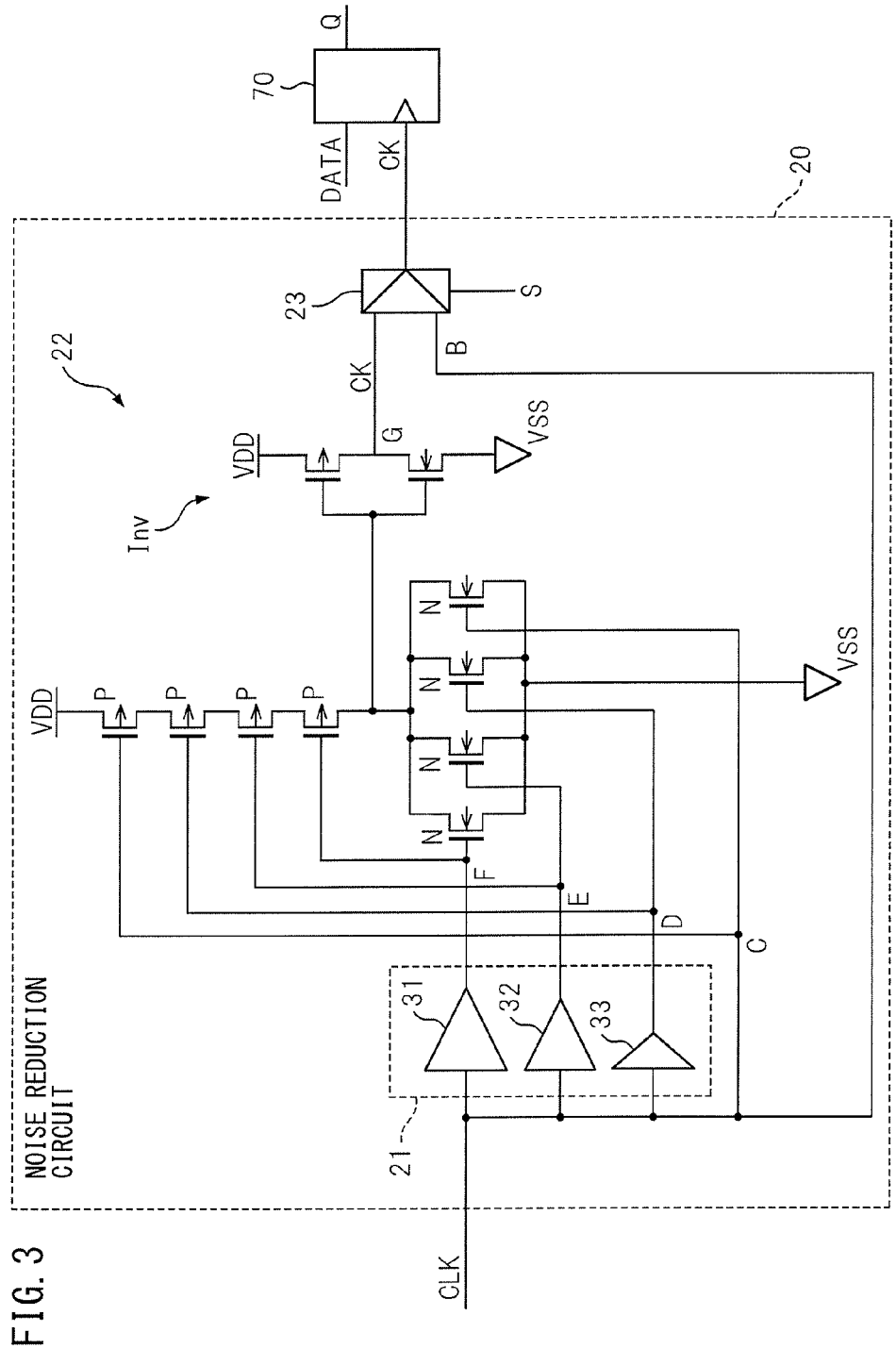
FIG. 3 is a circuit diagram illustrating an OR gate of the noise reduction circuit of the first embodiment at a transistor level.

FIG. 3 is a circuit diagram illustrating an OR gate 22 of the noise reduction circuit 20 of the first embodiment at a transistor level. As illustrated in FIG. 3, the OR gate 22 has a NOR circuit in which four Pch transistors connected in series and four Nch transistors connected in parallel are connected in series between a power source VDD and VSS, and an inverter Inv. To the gates of the four Pch transistors and the four Nch transistors, CLK input as the signal C and the plurality of the delayed clocks D, E, and F are applied, respectively. The OR gate in FIG. 3 is a widely known circuit, and therefore, detailed explanation thereof if omitted.

The operation of the noise reduction circuit 20 of the first embodiment is explained together with the noise reduction circuit 20 of a second embodiment, to be described later.

Figure 4:
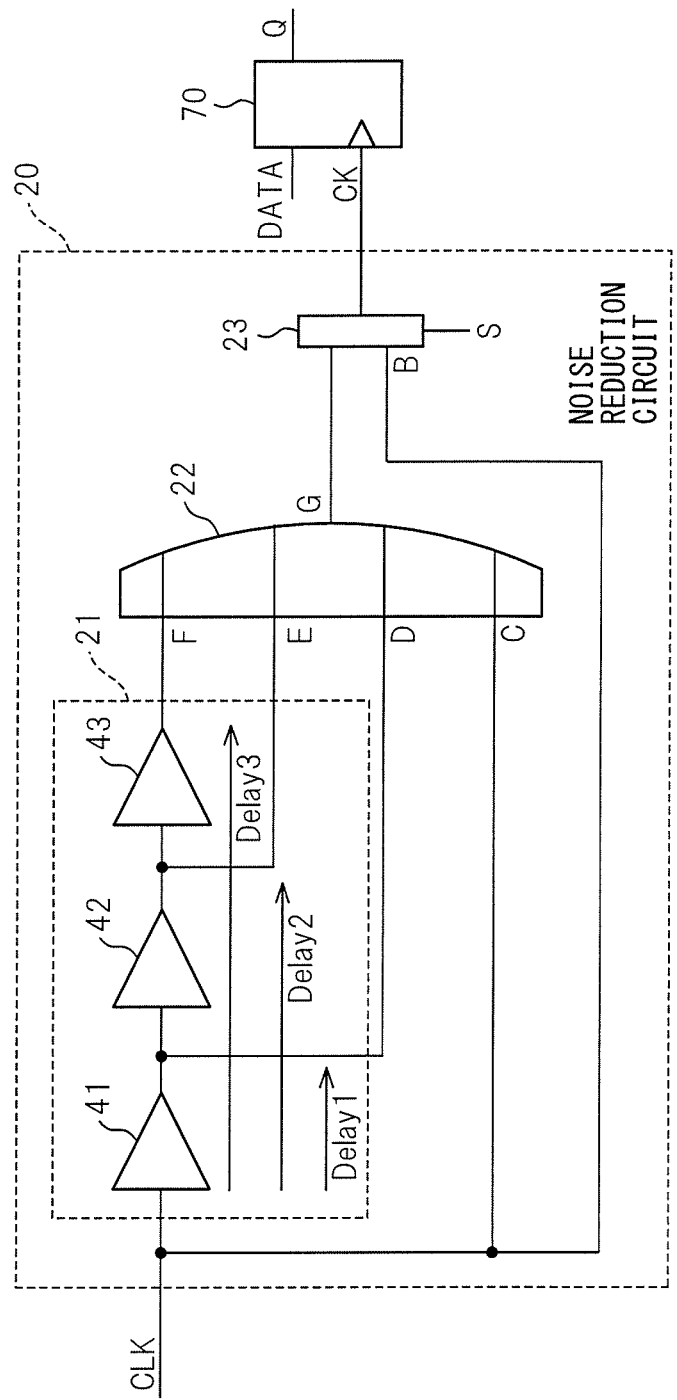
FIG. 4 is a diagram illustrating a circuit configuration of the noise reduction circuit of the second embodiment.

FIG. 4 is a diagram illustrating a circuit configuration of the noise reduction circuit 20 of the second embodiment. The noise reduction circuit 20 of the second embodiment differs from that of the first embodiment in the circuit configuration of the plural delayed clock generation circuit 21 but other portions are the same.

As illustrated in FIG. 4, the plural delayed clock generation circuit 21 of the noise reduction circuit 20 of the second embodiment has three delay circuits 41 to 43 connected in series in three stages and to the delay circuit 41 in the first stage, CLK is input. The output of the delay circuit 41 in the first stage is the delayed clock D, the output of the delay circuit 42 in the second stage is the delayed clock E, and the output of the delay circuit 43 in the third stage is the delayed clock F. The delay circuits 41 to 43 are realized by, for example, connecting in series buffer circuits in which two identical inverters are connected in series in a predetermined number of stages. The delayed clocks D, E, and F are delayed from CLK by delay 1, delay 2, and delay 3 and delay 1<delay 2<delay 3 holds.

FIG. 5 is a time chart illustrating the operation of the noise reduction circuit 20 of the first and the second embodiment.

As illustrated in FIG. 5, the clock CLK repeats the change from L to H and from H to L in a predetermined period. It is assumed that the flip-flop (FF) forming the scan circuit latches the status value of the logical circuit when CLK changes from L to H. In this case, immediately after CLK changes from L to H, a large current flows and the voltage of the power source circuit drops for an instant and noise occurs in CLK.

It is assumed that a signal B input to the selector 23 as the signal C and the signal input to the OR gate 22 are not delayed and are the same as CLK. The delayed clocks D, E, and F are delayed from CLK by delay 1, delay 2, and delay 3 and delay 1<delay 2<delay 3 holds, and therefore, as illustrated in FIG. 5, the rise edge from L to H and the noise position are also delayed. The OR gate 22 performs the logical sum operation of the four signals C to F, and therefore, the voltage drop caused by noise after the change from L to H at the rise edge of CLK is cancelled by the rise of the delayed clocks D, E, and F. Consequently, as illustrated in FIG. 5, the output G of the OR gate 22 changes from L to H at the change edge from L to H of CLK and the voltage may drop slightly from the H level, however, the voltage never drops below a threshold level VTH of the FF of the scan circuit.

Figure 6A:
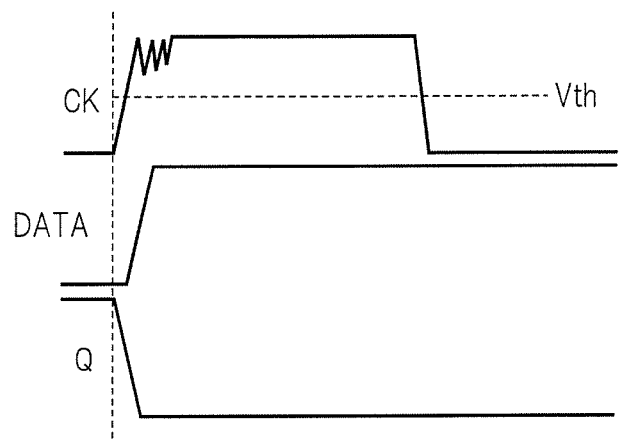
FIG. 6A and FIG. 6B are time charts illustrating the operation of the FF of the scan circuit in response to the clock CK.
Figure 6B:
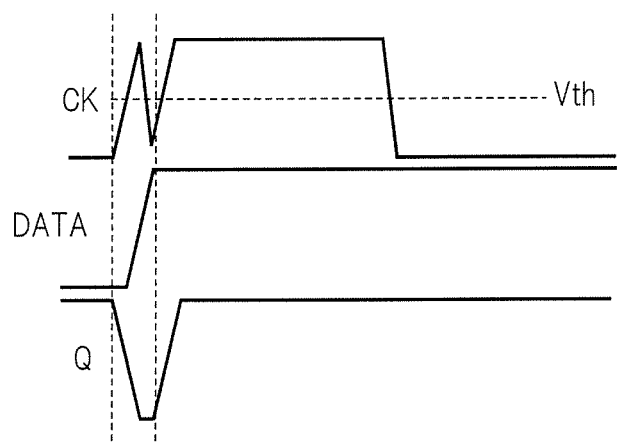

FIG. 6A and FIG. 6B are time charts illustrating the operation of the FF 70 of the scan circuit in response to the clock CK. FIG. 6A illustrates the operation of the FF in the case where the signal G from which noise is removed in the noise reduction circuit 20 of the first and the second embodiment is supplied as CK to the FF 70 of the scan circuit. FIG. 6B illustrates the operation of the FF in the case where the clock CLK (signal B) from which noise is not removed is supplied as CK to the FF 70.

As illustrated in FIG. 5, the signal G output from the OR gate 22, i.e., CK never drops below the threshold level VTH of the FF of the scan circuit although the voltage fluctuates somewhat during the period from the change from L to H until it changes to L normally. As illustrated in FIG. 6A, the FF 70 latches DATA at the rise edge of CK. FIG. 6A illustrates an example in which DATA is at L at the rise edge of CK and then changes to H, and an output Q of the FF 70 changes from H to L. Because CK never drops below the threshold level VTH, the FF 70 does not perform the latch operation again, and therefore, the output Q of the FF 70 is kept at L. In other words, the operation is normal.

In contrast, as illustrated in FIG. 6B, in the case where CLK (signal B) in which noise has occurred is supplied as CK to the FF 70, the FF 70 latches DATA at the rise edge of CK and the output Q changes from H to L. CK drops below the threshold level VTH temporarily by noise immediately after the change from L to H, and therefore, the FF 70 performs the latch operation again and because DATA at H is latched, the output Q changes to H and H is kept afterward. In other words, an erroneous operation occurs.

The normal noise reduction circuit illustrated in FIG. 1A does not remove noise whose width is greater than the delay amount (Delay), and therefore, the delay amount is set to a certain level or more in order to remove noise whose width is great. On the other hand, noise that occurs within the delay amount from the rise edge of the input signal IN (CLK) is not removed. In other words, there has been such a problem that if the delay amount is increased, the time range in which noise immediately after the rise edge is not removed increases.

In contrast, in the noise reduction circuit of the first and the second embodiment, the delayed clocks D, E, and F the delay mounts of which from CLK are different are generated and the OR gate 22 performs the logical sum operation of CLK and D, E, and F. Due to this, the noise having the width equal to the largest delay amount of the delayed clocks D, E, and F is removed, and also the time range in which the noise immediately after the rise edge is not removed will be less than the smallest delay amount. The number of delayed clocks with different delay amounts is not limited to three and there may a case where the number may be two or a case where the number is preferably four or more.

The noise reduction circuit of the first and the second embodiment is a circuit configured to remove only noise when the clock CLK changes from the H level to L. The reason is that the noise desired to be removed is the noise that occurs at the time of the shift operation of the FF of the scan circuit and the noise that rides on the signal at the H level of the signal line of the clock CLK. To explain in more detail, noise occurs when the scan circuit is activated after the clock CLK changes from L to H, and therefore, the noise to be removed is the noise which occurs when the clock signal is at the H level.

Further, in the noise reduction circuit, the delay at the fall change edge of the clock CLK from H to L occurs, however, the delay at the rise change edge from L to H does not occur. As described previously, the scan circuit latches the status value of the logical circuit at the rise edge of the clock CK, however, the rise change edge is not delayed, and therefore, the result of the latch operation is not affected.

The actual clock takes time to change. The time taken for the rise edge when the clock changes from the L level to the H level is denoted by tr and the time taken for the fall edge when the clock changes from the H level to the L level is denoted by tf.

In the following, a method for setting the number of delay circuits and the delay amount by taking into consideration the time of the change edge of the clock is explained on the assumption that a delay amount t of each delay circuit is the same in the noise reduction circuit of the second embodiment in FIG. 4.

The delay amount t of each delay circuit is set to a value smaller than both tr and tf. This is taken to be the first condition.

Next, the number of delay circuits is set so that a delay amount td of all the delay circuits is greater than the maximum width of the noise to be removed. For example, if the number of delay circuits is taken to be k, kt>maximum noise width is caused to hold. This is taken to be the second condition.

FIG. 7A to FIG. 7C are diagrams for explaining the grounds of the first condition described above.

In FIG. 7A, the solid line represents the clock CLK in which noise has occurred in the case where tr=tf, and the dotted line presents a delayed clock DCLK delayed from CLK by tr=tf. As illustrated in FIG. 7A, in the case where tr=tf, by setting td so as to satisfy td≤tr=tr, the logical sum of CLK and DCLK does not become smaller than VTH. If the delay amount of each delay circuit is taken to be t, the number k of delay circuits is set so that kt>td holds.

In FIG. 7B, the solid line represents CLK in the case where tr>tf, the dotted line represents a delayed clock tfDCLK, which is CLK delayed by td=tf, and the broken line represents a delayed clock trDCLK, which is tfDCLK delayed by td=tr. As illustrated in FIG. 7B, because tf is smaller than tr, if noise occurs immediately after CLK turns to the H level, there may be a case where the logical sum of CLK and trDCLK becomes smaller than VTH in a region P and an erroneous operation occurs. Conversely, because tr is larger than tf, tfDCLK becomes smaller than VTH before CLK becomes larger than VTH, and therefore, the logical sum of CLK and tfDCLK becomes smaller than VTH in a region Q and an erroneous function occurs. Consequently, the delay amount t of each delay circuit is made smaller than tf and the logical sum is prevented from becoming smaller than VTH in the region Q by the second delayed clock.

In FIG. 7C, the solid line represents CLK in the case where tr<tf, the dotted line represents the delayed clock trDCLK, which is CLK delayed by td=tr, and the broken line represents the delayed clock tfDCLK, which is trDCLK delayed by td=tf. As illustrated in FIG. 7C, because tr is smaller than tf, if noise occurs immediately after CLK turns to the H level, there may be a case where the logical sum of CLK and tfDCLK becomes smaller than VTH in the region P and an erroneous operation occurs. Conversely, because tf is larger than tr, trDCLK becomes smaller than VTH before CLK becomes larger than VTH, and therefore, the logical sum of CLK and trDCLK becomes smaller than VTH in the region Q and an erroneous operation occurs. Consequently, the delay amount t of each delay circuit is made smaller than tr and the logical sum is prevented from becoming smaller than VTH in the region Q by the second delayed clock.

As explained above, in the noise reduction circuit of the second embodiment in FIG. 4, if the delay amount t of each delay circuit and the number of delay circuits are set so as to meet the first and the second conditions, the processing clock CK does not becomes smaller than VTH temporarily.

Figure 8:
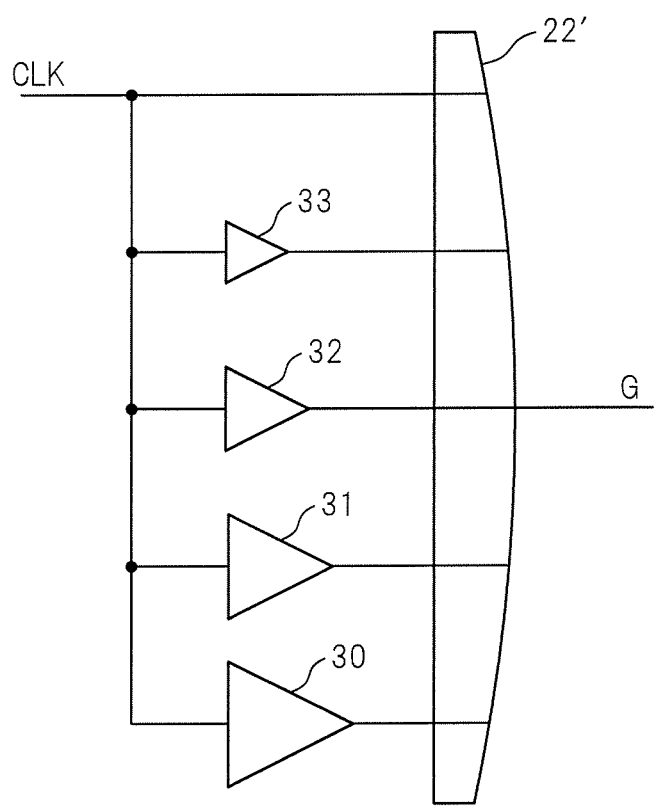
FIG. 8 is a diagram illustrating a modification example of the portion of the plural delayed clock generation circuit and the OR gate in the noise reduction circuit of the first embodiment.

FIG. 8 is a diagram illustrating a modification example of the portion of the plural delayed clock generation circuit and the OR gate in the noise reduction circuit of the first embodiment. In the modification example, the plural delayed clock generation circuit has four delay circuits with different delay amounts, i.e., a delay circuit 30 and the delay circuits 31 to 33. The OR gate is a five-input OR gate 22' configured to receive CLK and outputs of the delay circuits 30 to 33 as inputs. The delay amounts of the delay circuits 30 to 33 are as follows: delay amount of the delay circuit 30>delay amount of the delay circuit 31>delay amount of the delay circuit 32>delay amount of the delay circuit 33.

In the modification example in FIG. 8, the delay amounts of the delay circuits 30 to 33 are set so to meet the above-mentioned first and second conditions by taking into consideration the time of the change edge of the clock. That is, the delay amount of the delay circuit 33 is set smaller than both tr and tf. Further, the delay amounts of the delay circuits 30 to 32 are set so as to satisfy the following relationship: delay amount of the delay circuit 32<delay amount of the delay circuit 33×2, delay amount of the delay circuit 31<delay amount of the delay circuit 32+delay amount of the delay circuit 33, and delay amount of the delay circuit 30<delay amount of the delay circuit 31+delay amount of the delay circuit 33. Further, the delay amount of the delay circuit 30 is set so as to satisfy the relationship: maximum noise width<delay amount of the delay circuit 30.

Next, an embodiment in which the noise reduction circuit of the first and the second embodiment is applied to the scan circuit is explained.

Figure 9:
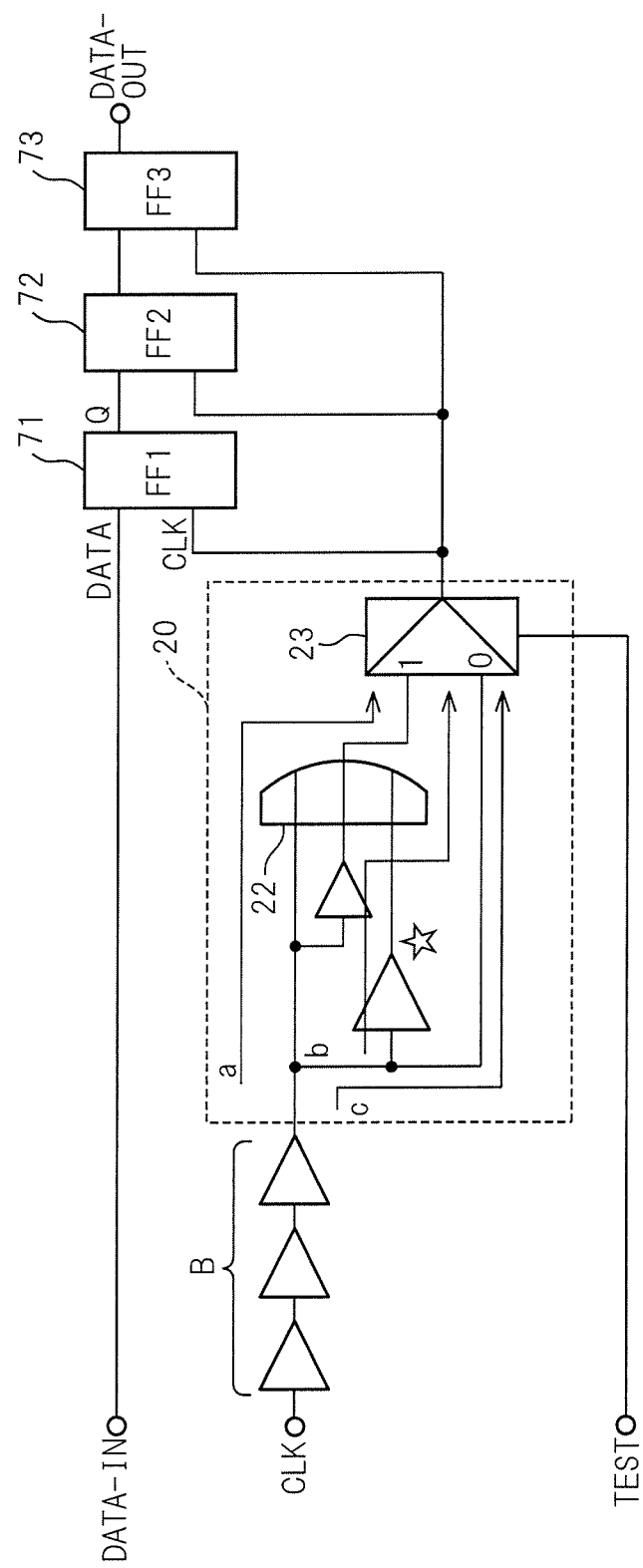
FIG. 9 is a circuit diagram illustrating a configuration of a semiconductor device of a third embodiment in which the noise reduction circuit of the first embodiment is applied to the scan circuit.

FIG. 9 is a circuit diagram illustrating a configuration of a semiconductor device of a third embodiment in which the noise reduction circuit of the first embodiment (however, in the example in which the number of delay circuits is two) is applied to the scan circuit.

A plurality of flip-flops (FF1 to FF3) 71 to 73 forming the scan circuit is connected in series so that an output Q of the previous stage is an input D of the subsequent stage and as a clock of the FFs 71 to 73, the processing clock CK output from the noise reduction circuit 20 is supplied. The clock CLK supplied to the noise reduction circuit 20 is input from a clock terminal and supplied via a buffer B. A TEST signal is fixed to H during the scan test and fixed to L during the system operation. The selector 23 of the noise reduction circuit 20 selects the output of the OR gate 22 and supplies the output to the FFs 71 and 72 during the scan test and selects CLK and supplies CLK to the FFs 71 and 72 during the system operation in accordance with the TEST signal. Input data DATA_IN input from a scan data input terminal is supplied to the first FF 71 and shifts and moves through FFs sequentially and output data DATA_OUT output from the final FF 73 is output from a scan data output terminal.

The portion illustrated in FIG. 9 is part of the scan circuit and in the actual scan circuit, a number of such circuits are connected between the input data DATA_IN and the output data DATA_OUT and it is desirable provide a plurality of the noise reduction circuits 20 also. The FFs 71 to 73 have a function to set data sent by the scan operation to the logical circuit and take in the data of the logical circuit and send by the scan operation, however, it does not relate to the disclosed technology directly, and therefore, it is not illustrated schematically. The scan circuit is widely known, and therefore, further explanation is omitted.

FIG. 10A and FIG. 10B are time charts illustrating the operation of the scan circuit in FIG. 9 and FIG. 10A illustrates the operation at the time of the scan test and FIG. 10B illustrates the operation at the time of the system operation. The period of a clock FF1. CLK supplied to the FF 71 (FF1) corresponding to the processing clock CK is the same at the time of the scan test and at the time of the system operation, however, at the time of the scan test, the portion of the H level is longer than that at the time of the system operation. The reason for this is that at the time of the scan test, the processing clock is generated by the logical sum of delayed clocks in order to remove noise in the noise reduction circuit 20. At the time of the scan test, the shift operation and the latch operation are performed in synchronization with the rise edge of the clock FF1. CLK, and therefore, there no problem occurs even if the portion of the H level becomes longer. In contrast, at the time of the system operation, the number of FFs that operate simultaneously is smaller than that at the time of the scan test and the operation is performed in the range of the load supposed at the time of the design, and therefore, an erroneous operation caused by noise due to the drop of the power source voltage is unlikely to occur. Because of this, CLK that passes through a path c in which noise reduction processing is not performed is supplied to the FFs 71 to 73 via the selector 23.

Figure 11:
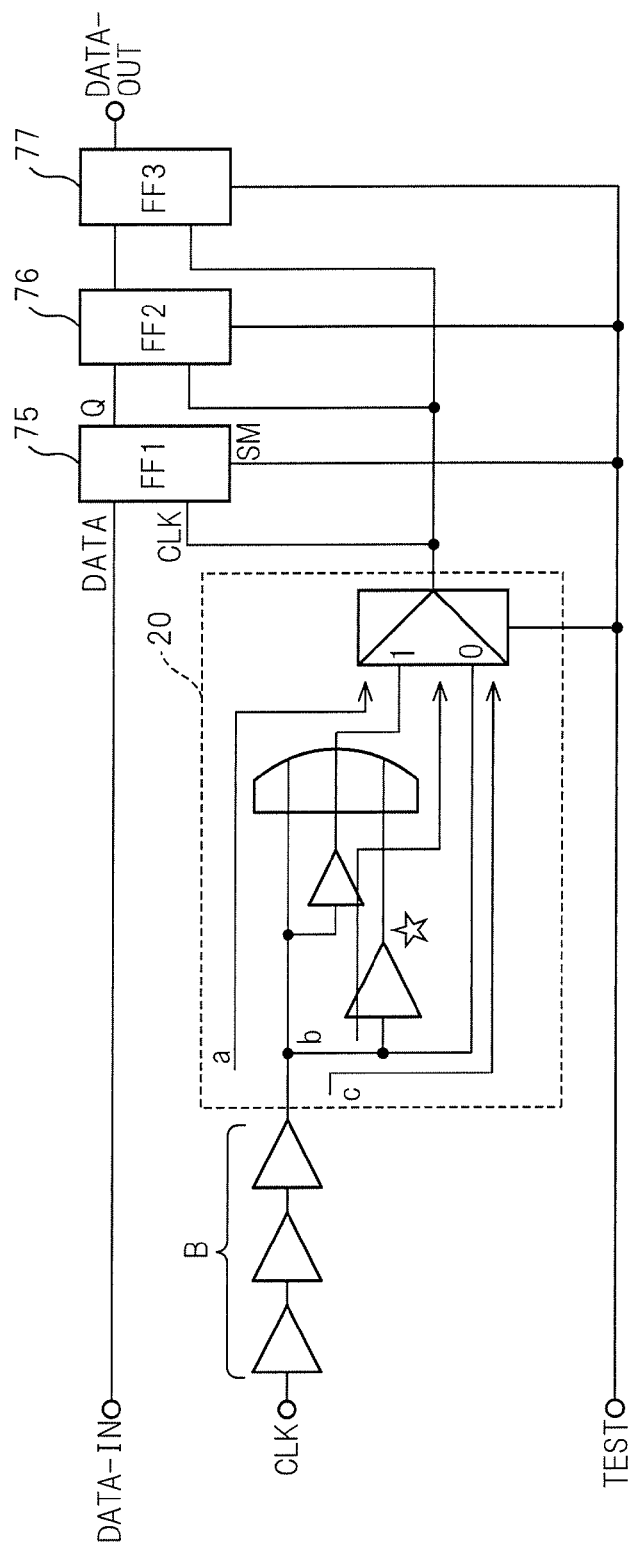
FIG. 11 is a circuit diagram illustrating a configuration of a semiconductor device of a fourth embodiment to which the noise reduction circuit of the first embodiment is applied to the scan circuit.

FIG. 11 is a circuit diagram illustrating a configuration of a semiconductor device of a fourth embodiment to which the noise reduction circuit of the first embodiment (however, in the example in which the number of delay circuits is two) is applied to the scan circuit.

The semiconductor device of the fourth embodiment has a scan circuit similar to that of the third embodiment and the noise reduction circuit 20, however, differs in that FFs (FF1 to FF3) 75 to 77 enter the operating state where the capture operation of data of the logical circuit is performed in accordance with the TEST signal.

The TEST signal turns to H only when the shift operation is performed during the scan test and turns to L in other cases. Consequently, at the time of the system operation, the test signal is at L and the FFs 75 to 77 perform the capture operation in accordance with the clock. At the time of the scan test also, the FFs 75 to 77 perform the capture operation in accordance with the clock when the test signal is at L.

FIG. 12 is a time chart illustrating the operation of the scan circuit in FIG. 11 at the time of the scan operation. As illustrated in FIG. 12, when the test signal TEST is at H, the clock FF1. CLK output from the noise reduction circuit 20 has the portion of the H level longer than that at the time of the system operation and the FFs 75 to 77 perform the shift operation. In contrast, when the test signal TEST is at L, the clock FF1. CLK output from the noise reduction circuit 20 is the signal corresponding to CLK and the FFs 75 to 77 perform the capture operation in accordance with the clock FF1. CLK. The capture operation is also affected by noise, however, larger noise occurs at the time of the shift operation and the problem of the erroneous operation occurs more frequently. In the case of the semiconductor device in FIG. 11, such a problem does not occur. In the semiconductor circuit in FIG. 11, the signal line to switch the operation of the FFs 75 to 77 to the capture operation can also be used as the signal line of the test signal, and therefore, the circuit configuration can be reduced in size.

As above, the first to the fourth embodiment are explained. With these embodiments, the effects as follows can be obtained.

Noise trouble at the time of the scan test is prevented.
It is possible to carry out the test without the need to limit the operation at the time of the scan test.
The operation limit circuit at the time of the scan test is not used.
The number of patterns can be reduced because the operation is not limited at the time of the scan test, and therefore, the test time can be reduced.
Noise trouble at the time of the scan test is prevented, and therefore, yield of the test can be enhanced.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electric circuit comprising:
a delayed clock generation circuit to which a first clock is supplied and which is configured to generate a first delayed clock and a second delayed clock, the first delayed clock being the first clock delayed by a first delay amount, and the second delayed clock being the first clock delayed by a second delay amount different from the first delay amount, wherein the first delay amount and the second delay amount are shorter than a clock period of the first clock;
an OR gate configured to receive the first clock, the first delayed clock, and the second delayed clock as inputs and to output a second clock;
a selector configured to: receive the first clock and the second clock, select one of the first clock and the second clock based on a mode signal, and output the selected one as a clock signal; and
a scan circuit including a shift register in which a plurality of flip-flop circuits are connected in a form of a chain, the scan circuit configured to capture data in synchronization with the clock signal when a mode signal indicates a second mode and to shift the captured data in synchronization with the clock signal when the mode signal indicates a first mode.

2. The electric circuit according to claim 1, wherein
the delayed clock generation circuit includes a first delay circuit and a second delay circuit connected in series, and the first delay circuit outputs the first delayed clock and the second delay circuit outputs the second delayed clock.

3. The electric circuit according to claim 1, wherein the selector selects the second clock when the mode signal indicates the first mode, selects the first clock when the mode signal indicates the second mode, and outputs the selected one as the clock signal.

4. The electric circuit according to claim 2, wherein the selector selects the second clock when the mode signal indicates the first mode, selects the first clock when the mode signal indicates the second mode, and outputs the selected one as the clock signal.

5. The electric circuit according to claim 1, wherein the first delay amount and the second delay amount are shorter than a rising time and a falling time of the first clock.

6. A semiconductor device comprising:
a logical circuit operating according to a first clock;
a scan circuit including a shift register in which a plurality of flip-flop circuits are connected in a form of a chain, the scan circuit configured to capture data output from the logical circuit to the plurality of flip-flop circuits in synchronization with a clock signal when a mode signal indicates a second mode and to shift the captured data in synchronization with the clock signal when the mode signal indicates a first mode; and a noise reduction circuit of the clock signal supplied to the scan circuit, wherein the noise reduction circuit comprises:

a delayed clock generation circuit to which the first clock is supplied and which is configured to generate a first delayed clock and a second delayed clock, the first delayed clock being the first clock delayed by a first delay amount, and the second delayed clock being the first clock delayed by a second delay amount different from the first delay amount, wherein the first delay amount and the second delay amount are shorter than a clock period of the first clock;

an OR gate configured to receive the first clock, the first delayed clock, and the second delayed clock as inputs and to output a second clock; and a selector configured to: receive the first clock and the second clock, select one of the first clock and the second clock based on a mode signal, and output the selected one as the clock signal.

7. The semiconductor device according to claim 6, wherein the selector selects the second clock when the mode signal indicates the first mode, selects the first clock when the mode signal indicates the second mode, and outputs the selected one as the clock signal.

8. The semiconductor device according to claim 7, wherein the plurality of the flip-flop circuits of the scan circuit performs a capture operation of an output of the logical circuit when the mode signal changes to indicate the second mode from the first mode, and performs a shift operation when the mode signal indicates the first mode.

\* \* \* \* \*